United States Patent
Barsoukov et al.

(10) Patent No.: US 6,789,026 B2
(45) Date of Patent: Sep. 7, 2004

(54) CIRCUIT AND METHOD FOR MONITORING BATTERY STATE OF CHARGE

(75) Inventors: Evgenij Barsoukov, Dallas, TX (US); Dan R. Poole, Austin, TX (US); David L. Freeman, McKinley, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/428,689

(22) Filed: May 2, 2003

(65) Prior Publication Data

US 2004/0128086 A1 Jul. 1, 2004

Related U.S. Application Data

(60) Provisional application No. 60/437,313, filed on Dec. 29, 2002.

(51) Int. Cl.[7] ................................................ G01R 31/36
(52) U.S. Cl. .................... 702/63; 320/104; 320/132; 324/427; 324/428
(58) Field of Search ............................... 702/63–67, 71; 320/104, 107, 134; 324/426, 427

(56) References Cited

U.S. PATENT DOCUMENTS

| | | | |
|---|---|---|---|
| 5,357,203 A | * | 10/1994 | Landau et al. ............... 324/427 |
| 5,691,078 A | | 11/1997 | Kozaki et al. ................. 429/92 |
| 5,949,217 A | | 9/1999 | Okada et al. ................ 320/132 |
| 6,061,639 A | | 5/2000 | Wistrand ...................... 702/63 |
| 6,107,779 A | | 8/2000 | Hara et al. ................... 320/132 |
| 6,404,163 B1 | * | 6/2002 | Kapsokavathis et al. .... 320/104 |

* cited by examiner

*Primary Examiner*—John Barlow
*Assistant Examiner*—John Le
(74) *Attorney, Agent, or Firm*—W. Daniel Swayze, Jr.; W. James Brady; Frederick J. Telecky, Jr.

(57) ABSTRACT

A processor (13) operates to determine amount of charge presently stored in a battery by determining that the battery is in a zero-current relaxed condition. Circuitry (16,23) including a first ADC (16) measures an open circuit voltage (OCV) of the battery prior to a period of time during which flow of current through the battery is not negligible. A program executed by the processor correlates the measured open circuit voltage (OCV0) with a corresponding value of the variable and selects the corresponding value as a value of the variable.

38 Claims, 4 Drawing Sheets

CIRCUIT AND METHOD FOR MONITORING BATTERY STATE OF CHARGE

This application claims the benefit of Provisional application No. 60/437,313, filed Dec. 29, 2002.

BACKGROUND OF THE INVENTION

The present invention relates generally to circuits and techniques for providing precise determination of the state of charge (SOC) of a battery or battery pack, and more particularly such circuits and techniques adapted to avoid errors in determination of the "state of charge" (SOC) of the battery caused by inaccurate measurement of low "standby" current drain and also adapted to avoid errors caused by inaccurate estimates of internal self-discharge current of the battery.

It is well known that a change in the state of charge (SOC) of a battery can be accurately determined by integrating the current flow out of the battery while it is actively supplying current to a battery-powered device, and also by integrating the current flow into the battery while it is being charged. The present SOC of a battery can be thought of as the presently stored charge expressed as a fraction of the maximum charge that can be stored in the battery. The sum of the SOC and DOD (depth of discharge) of a battery is equal to 1, so the DOD, which is more useful than the SOC for some computations, is given by the expression DOD=1−SOC.

In many cases the battery-powered device spends a great deal of time in an "idle" or "sleep" condition (referred to as a passive phase) during which only a very low "idle" or "stand-by" current is delivered by the battery to the battery-powered device. It is difficult to provide sufficiently precise measurements of the low stand-by current that are needed to achieve a sufficiently accurate integration of the stand-by current to determine the change in the SOC occurring during the passive phase or standby-condition.

Furthermore, batteries have internal self-discharge currents that are not associated with any external current delivered by the battery. The self-discharge current of a battery results in further reduction of the SOC of the battery over a period of time, but cannot be directly measured and integrated along with the external current flow through the battery in order to determine a change in the SOC of the battery. To further complicate matters, the self-discharge currents of various cells that are included in a battery pack may be different. Other errors which are difficult to account for (such as differences in battery charging efficiency depending on charging conditions, charging termination, and temperature) also affect the precision of the estimation of the SOC of a battery.

It also is well known that the no-load voltage produced by a battery accurately indicates the state of charge of the battery if no load has been recently applied to the battery (e.g., within the prior one-half hour to several hours) for a substantial period of time. However, when the battery load varies more frequently during operation of the battery-powered device, the measured no-load battery voltage does not accurately indicate the state of charge of the battery.

A disadvantage of the conventional technique of correcting the SOC of a battery by measuring the passive or stand-by discharge current and numerically correcting the measured standby current values is that the current measurement error is high. Another disadvantage of the foregoing conventional technique is that any estimation of the actual low standby current level is difficult, especially since the standby currents for different devices powered by the same battery may be substantially different.

Also, the conventional technique of correcting a battery's SOC by using a generalized model of the self-discharge current of a battery is inadequate because the self-discharge of a battery is a very complex process that is different for different batteries, different manufacturers, and even between different series-connected cells in a particular battery. Also, the self-discharge of a battery is a strong function of the voltage at which the self-discharge begins, the temperature, and the "age" of the battery, and can only be roughly accounted for. The foregoing factors cause conventional correction techniques for battery self-discharge to be very inaccurate. Note that the "age" of a battery is generally understood to refer more to the number of charge/discharge cycles to which the battery has been subjected than to the actual amount of time that the battery has existed.

Unfortunately, conventional voltage-based algorithms use stored multiple dimensional look-up tables that do not adequately represent the characteristics of a battery as it ages.

The look-up tables are used to predict the SOC during active battery operation by making corrections for the internal battery resistance and temperature during operation of the portable battery-powered device. However, because of the complex AC frequency dependence of internal battery impedance, the conventional approximation of battery impedance as a resistance is very imprecise and results in large errors due to load transient effects. The extensive computations that would be required to accurately account for load transient effects have been impractical for applications, such as mobile applications or microcontroller applications, in which a limited amount of computer power is available.

Thus, there is an urnmet need for a circuit and method for avoiding the errors associated with measurement and integrating of extremely low standby currents supplied by a battery to a user device.

There also is an unmet need for a circuit and method for avoiding the errors in modeling and computing self-discharge currents of a battery.

There also is an unmet need for a circuit and method which avoid both the errors associated with measurement and integrating of extremely low standby currents supplied by a battery to a the user device and errors in modeling and computing self-discharge currents of a battery.

There also is an unmet need for a circuit and method for determining the SOC of a battery connected to provide power to a user device without errors caused by inaccuracies in measurement of low standby current of a user device and without errors in estimating self-discharge current of the battery.

There also is an unmet need for a circuit and method for determining the SOC of a battery connected to provide power to a user device without errors caused by using battery voltage under load conditions to determine the SOC, wherein the errors would be caused by the complexity of the battery impedance and its variability with SOC, aging, temperature, deviations in manufacturing process, and transient effects due to changing load on the battery.

SUMMARY OF THE INVENTION

It is an object of the present invention to provide a circuit and method for avoiding the errors associated with measurement and integrating of extremely low standby currents supplied by a battery to a user device.

It is another object of the invention to provide a circuit and method for avoiding the errors in modeling and computing self-discharge currents of a battery.

It is another object of the invention to provide a circuit and method which avoid both the errors associated with measurement and integrating of extremely low standby currents supplied by a battery to a user device and the errors in modeling and computing self-discharge currents of a battery.

It is another object of the invention to provide a circuit and method for determining the SOC of a battery connected to provide power to a user device without errors caused by inaccuracies in measurement of low standby current of a user device and without errors in estimating self-discharge current of the battery.

It is another object of the invention to provide a circuit and method for determining the SOC of a battery connected to provide power to a user device without errors caused by using battery voltage under load conditions to determine the SOC, wherein the errors would be caused by the complexity of the battery impedance and its variability with SOC, aging, temperature, deviations in manufacturing process, and transient effects due to changing load on the battery.

Briefly described, and in accordance with one embodiment, the present invention provides a method and system for determining a value of variable representing the amount of charge presently stored in a battery and includes determining that the battery is in a zero-current relaxed condition by establishing that no more than a negligible amount of external current is flowing through the battery and that a sufficient amount of time has passed since a last significant current flow through the battery to ensure that the battery voltage is no longer significantly changing. An open circuit voltage (OCV) of the battery is measured prior to a period of time during which flow of current through the battery is not negligible. The measured open circuit voltage (OCV0) is correlated with a corresponding value of the variable. The corresponding value is selected as a value of the variable. In the described embodiment, current flowing through the battery is measured at a moment in an active period during which current flowing through the battery is not negligible, and the value of the variable at that moment is calculated using the measured current and an earlier value of the variable determined immediately prior to re-connecting a load or a charger. The value of the variable is calculated by integrating the current during the active period and modifying the earlier value of the variable by a value of charge passed through the battery during the active period divided by a value of total no-load capacity of the battery. The variable can be the state of charge (SOC) of the battery or the depth of discharge (DOD) of the battery. A correction of the measured voltage of the battery may be performed to compensate for a voltage drop due to the internal impedance of the battery while a nearly negligible amount of current is flowing through the battery in order to obtain the open circuit voltage.

In the described embodiment, a database is stored in a memory (15), data of the database representing a relationship between the OCV of the battery and the DOD of the battery, and the database is used to correlate the measured open circuit voltage (OCV0) with a corresponding value (DOD0) of the DOD. The temperature of the battery is monitored by means of a temperature sensor (14) in thermal contact with the battery, and the database includes data representing corresponding values of the OCV of the battery and DOD of the battery as K values of OCV of the battery at known corresponding values of DOD of the battery at each of N temperatures T1, T2 . . . TN, the database also including K intercepts A[k] and K slopes B[k] defining K equations V[k](T)=A[k]+B[k]*T, wherein k is an index and T is a variable representing the temperature of the battery, and the values A[k] and B[k] have been obtained by linear regression of the OCV and DOD values, the method including operating a processor (13) to execute a first algorithm utilizing a table search algorithm and a root-finding algorithm in conjunction with the database to determine values of DOD corresponding to values of OCV measured from the battery.

In a one described embodiment the processor (13) executes a second algorithm to determine a value of total run-time (t_total) that would be required for the load, when operatively connected to the battery, to reduce the open circuit voltage of the battery to a predetermined lower limit (Vmin).

DETAILED DESCRIPTION OF THE PREFERRED EMBODIMENTS

Figure 1A:
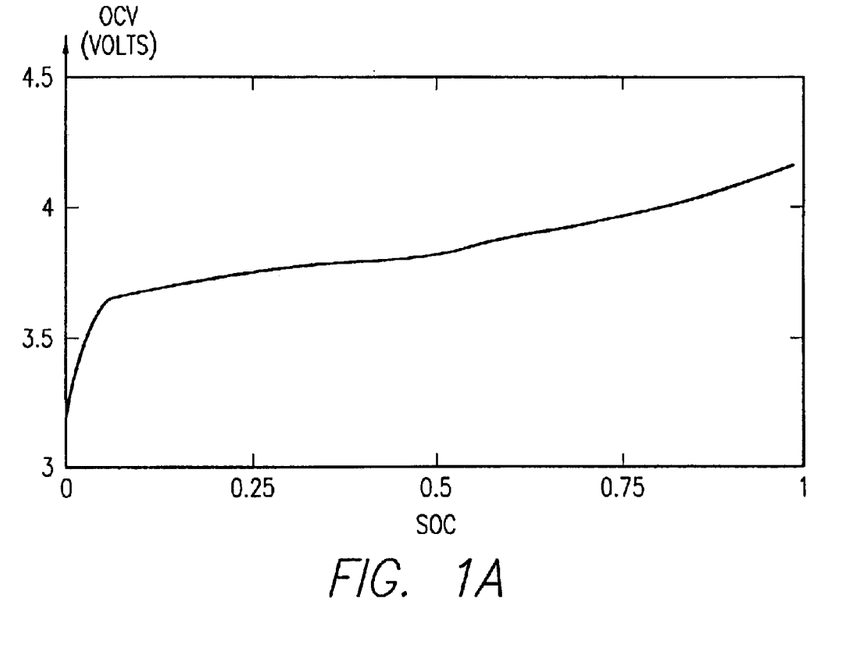
FIG. 1A is a curve of OCV (open circuit battery voltage) vs. SOC (state of charge) of a battery at a particular temperature.
Figure 1B:
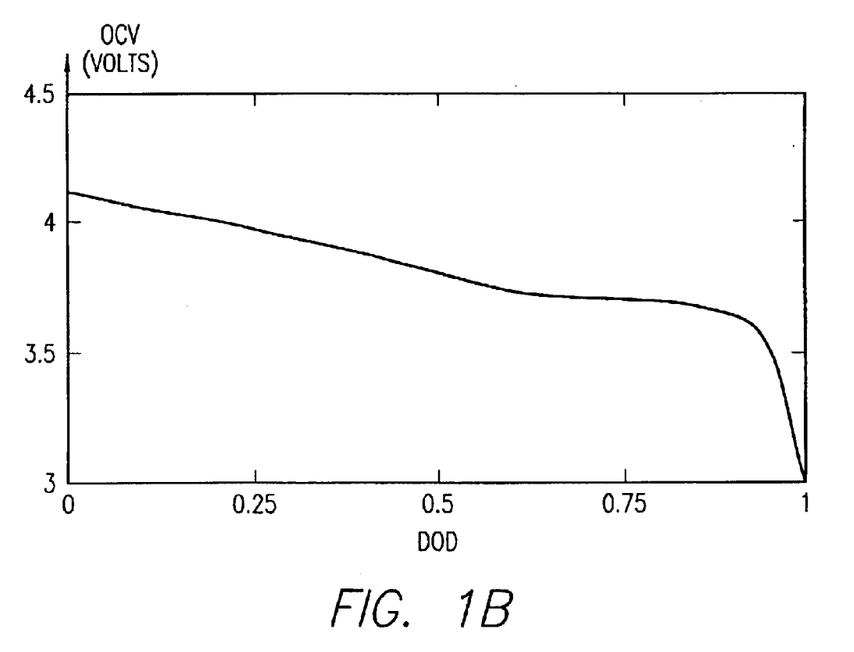
FIG. 1B is a curve of OCV (open circuit battery voltage) vs. DOD (depth of discharge) corresponding to the curve of FIG. 1A.

The state of charge (SOC) of a battery is sometimes used to indicate how much available charge remains in the battery. The present depth of discharge (DOD) of battery is related to the SOC by the equation DOD=1–SOC, and is usually utilized to obtain a computation of the remaining run-time of a device powered by the battery. FIGS. 1A and 1B illustrate the SOC characteristic and corresponding DOD characteristic, respectively, of a battery.

The cell voltage can be determined by measuring or otherwise determining the voltage across an individual single cell or by measuring the voltage across a particular number of series-connected cells with subsequent dividing of the value by the particular number of series-connected cells to obtain the voltage across one cell, thus obtaining the average cell voltage. The relationship of the resulting average cell voltage to the SOC (or DOD) of the entire battery will be the same as the relationship of a single cell open-circuit voltage to the SOC (or DOD) of the battery. The foregoing relationship is generally defined by a look-up table (which will be different for batteries having different chemistries) that represents the curve of the open circuit battery voltage OCV vs. SOC or DOD as shown in FIGS. 1A and 1B.

The DOD(OCV) dependence or characteristic is generally applicable to all batteries having a particular chemistry. For example, a comparison of the OCV vs. DOD for four different batteries from four different manufacturers shows that the OCVs do not differ by more than approximately 5 millivolts, so the same database can be used for all (e.g., lithium ion) batteries of the same chemistry. Each OCV measurement is made for a known DOD, the first OCV measurement being made when the battery has been fully charged and relaxed. Similarly, the next OCV measurement is made after a known amount of charge has been discharged from the battery and it has relaxed, so the second DOD is known, and so forth for each additional OCV measurement, until one of the successively measured OCV values is reduced to manufacturer's Vmin.

The technique of the present invention involves operating a processor to execute a store program for measuring or determining the open circuit battery voltage during a passive phase (i.e., when the battery powered device is off) at a time immediately prior to the time at which the battery-powered device is turned on and the battery is in a relaxed condition. Alternatively, the battery can be operatively coupled to a charger instead of to the battery-powered device, and the no-load to voltage measurement is made either prior to the beginning of charging or after termination of the charging and the passing of a suitably long relaxation period. After a suitable OCV measurement is obtained, the processor refers to a suitable look-up table to convert the open circuit battery voltage to a present accurate SOC or DOD value for the battery. Subsequently, the charging current or discharging current is integrated and the SOC is incremented using the resulting knowledge of the amount of total passed charge and the total charge of the battery.

Figure 3A:
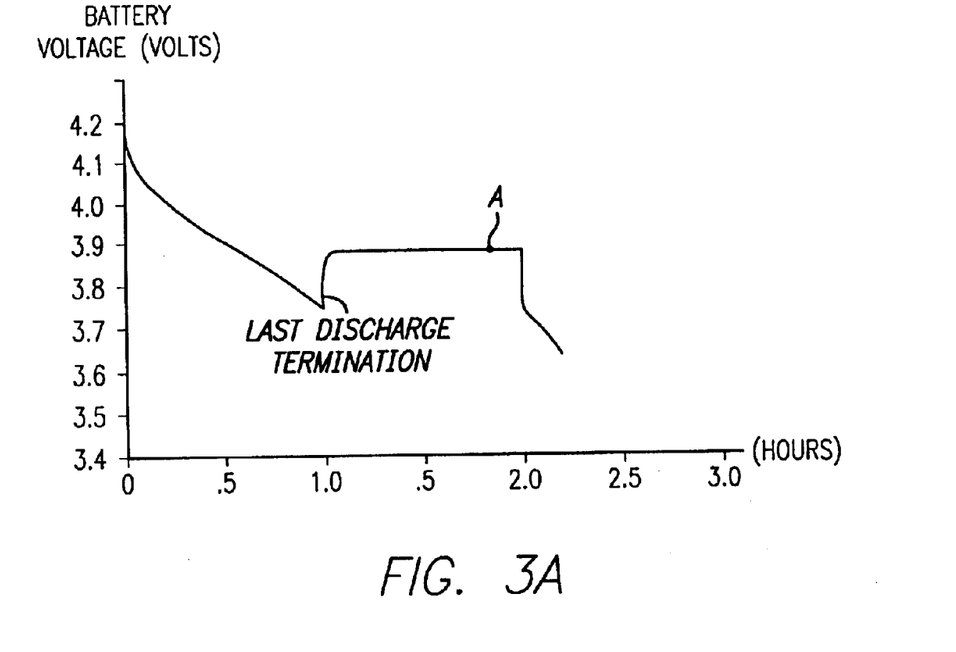
FIG. 3A is a graph illustrating relaxation of open-circuit battery voltage as a function of time after a discharging cycle and also illustrating a suitable time for measurement of OCV.
Figure 3B:
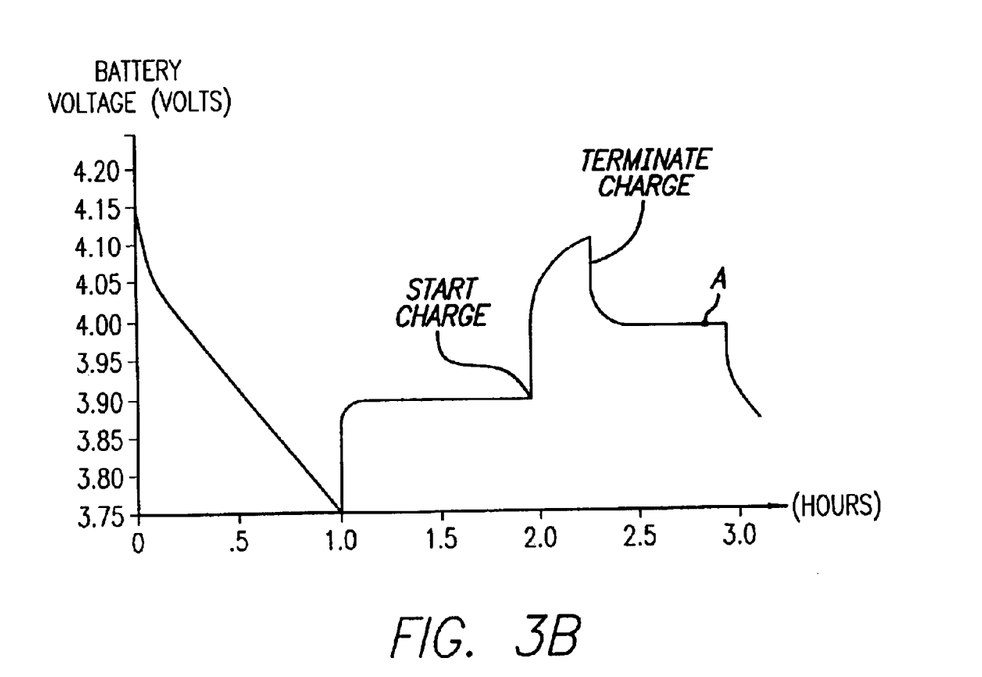
FIG. 3B is a graph illustrating relaxation of open-circuit battery voltage as a function of time after a charging cycle and also illustrating a suitable time for measurement of OCV.

As indicated previously, the no-load battery voltage is not an accurate indicator of battery SOC or DOD if a substantial current has been flowing through battery lasts than approximately one half hour to several hours before the voltage measurement (depending on the particular battery type or various other considerations). FIG. 3 indicates an appropriate time labeled "A" for the measurement of an open circuit voltage after a load has been operatively disconnected from the battery at the point labeled "Last Termination" and the battery has completely relaxed.

Figure 2:
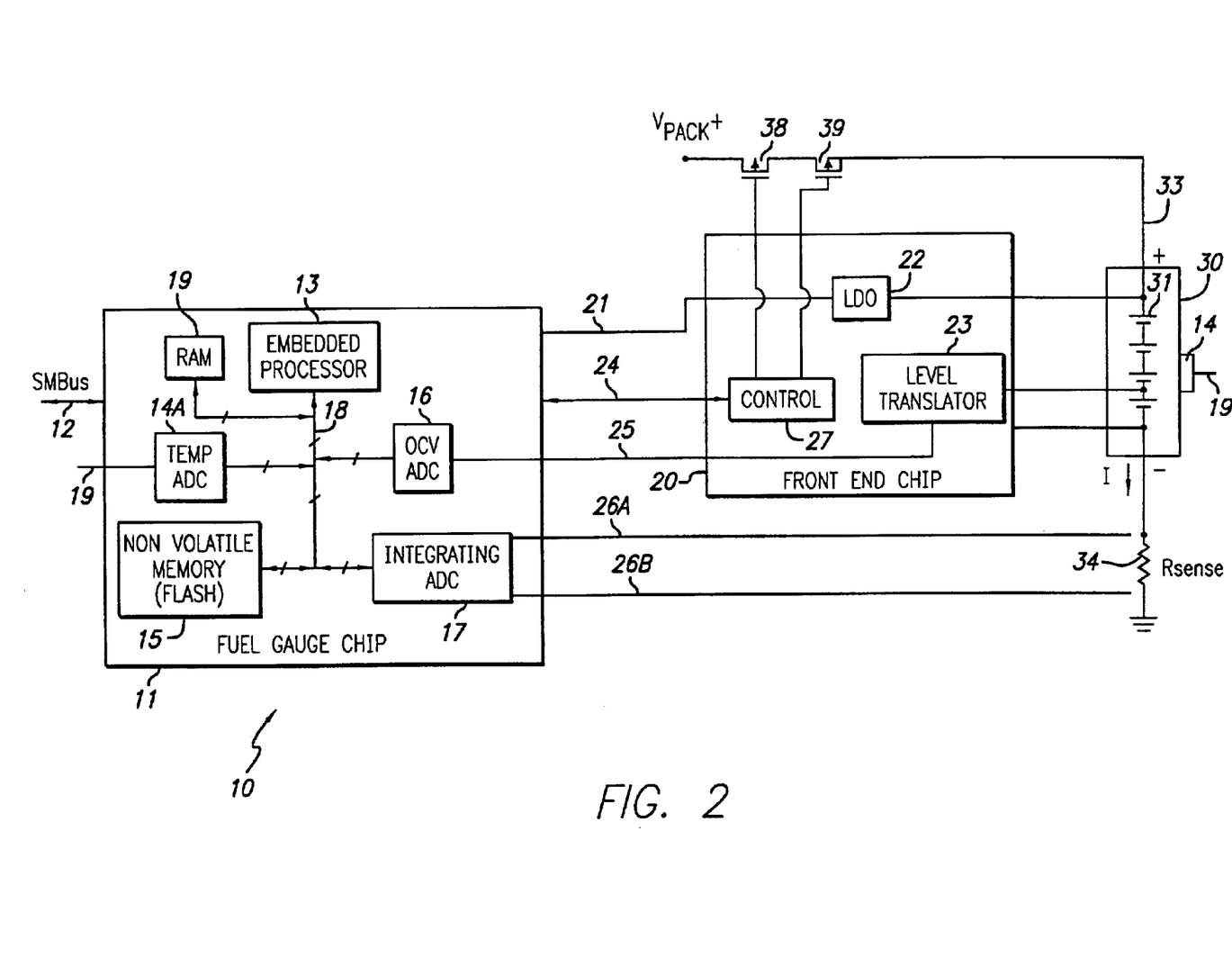
FIG. 2 is a block diagram of a "battery fuel gauge" product that includes the present invention.

Referring to FIG. 2, a "battery fuel gauge system" 10 includes a "battery fuel gauge" integrated circuit chip 11 that includes the above-mentioned processor as an embedded processor 13 coupled by a bidirectional digital bus 18 to a temperature sensor circuit 14, a nonvolatile memory 15, a random access memory (RAM) 19, an analog-to-digital converter (ADC) 16, and an integrating analog-to-digital converter 17. The temperature sensor circuit 14 is coupled to an external sensor 19 which is directly attached to the battery 30 shown in FIG. 2. Nonvolatile memory 15 could be a conventional flash memory, ADC 16 and ADC 17 both can be conventional analog-to-digital converters, and embedded processor 13 can, for example, be a commercially available 8 MHz processor having an 8-bit central processing unit (CPU) and a RISC architecture. Various suitable embedded processors that are commercially available can be utilized. For example, the Assignee's MSP430 microprocessor is capable of performing the necessary computations, or an embedded processor such as the one used in the Assignee's BQ8012 fuel gauge chip can be used.

Fuel gauge chip 11 is coupled to a standard SMBus (smart bus) 12 by means of which the fuel gauge chip 11 communicates with another processor (not shown) in accordance with a suitable communications protocol. A conventional interface circuit (not shown) is coupled between SMBus 12 and digital bus 18. Fuel gauge chip 11 is powered by a supply voltage on conductor 21, which is connected to the output of a low dropout (LDO) voltage regulator circuit 22 which is included in a "front end" integrated circuit chip 20. A bidirectional digital bus 24 is coupled between conventional digital interface circuitry (not shown) in accordance with a standard I2IC in integrated circuit 11 and control circuitry 27 in fuel gauge chip 20. Front-end chip 20 also includes a level translator circuit 23 that is coupled by suitable circuitry (not shown) to measure the voltage across one (or more) of the individual lithium-ion cells 31 included in a battery 30 which is used to provide power to a utilization device (not shown) coupled between the "battery pack" terminals V+ and ground. Level translator circuit 23 produces an output that is connected by conductor 25 to the analog input of ADC 16 in integrated circuit 11. I ADC 16 converts the cell voltage to a digital equivalent that can be accessed via digital bus 18 by embedded processor 13.

The total voltage across battery 30 (which can be considered to be equal to the voltage across one of the cells multiplied by the number of cells connected in series) is applied to an input of voltage regulator 22. A 1–100 milli ohm sense resistor 34 is coupled between ground and the (−) terminal of battery 30, and the voltage across sense resistor 34 is applied as an input to integrating ADC 17, which converts the voltage across sense resistor 34 to a digital representation of the battery current flowing through sense resistor 34. The (+) terminal of battery 30 is connected by conductor 33 to the source of a power transistor 39, the gate of which is connected to control circuit 27 and front end chip 20. The drain of power transistor 39 is connected to the drain of power transistor 38, the source of transistor 39 is connected to the battery pack voltage V+, and the gate of transistor 39 is connected to control circuitry 27. The gate of transistors 38 and 39 are controlled in response to signals received by front-end chip 20 from embedded processor 13 via bus 24. Transistor 39 is a discharge transistor and transistor 38 is a charging transistor. Front-end chip 20 includes the conventional interface and control circuitry 27 coupled to bidirectional digital bus 24 in accordance with the standard I2IC protocol in order to control power transistors 38 and 39.

Various information can be sent from fuel gauge chip 11 via digital bus 24 to front-end chip 20 in order to set various levels and to transmit various safety/control information to front-end chip 20, for example to turn the power transistors 38 and 39 on and off under appropriate conditions.

Embedded processor 13 executes a program represented by the subsequently described flowchart of FIG. 4 to effectuate entry of a database representative of characteristics of the battery 30, measurement of open circuit voltages (OCV) of battery 30, and determination of a "starting DOD" that corresponds to the most recently measured value of OCV after the battery has stabilized. (Embedded processor 13 may also execute programs to determine the present DOD of the battery, the present battery capacity, and the remaining run-time of the device powered by the battery.)

The above mentioned starting DOD (i.e., DOD0) can be used to compute the present state of charge (or DOD), knowing the amount of charge passed during the present charging or discharging operation and the total no-load (i.e., no-current) battery capacity (Qmax). Qmax is defined as the amount of capacity (i.e., charge) required to pass through the battery to reduce the open circuit voltage OCV from the manufacturer's specified maximum voltage Vmax (e.g., 4.2 volts for a lithium-ion battery) to the manufacturer's specified minimum voltage Vmin (e.g., is 2.7 volts for a lithium-ion battery). By way of definition, the terms "no-load" or "no-current" battery capacity mean that the current flow through the battery is so low as to be not appreciable in its effect on an OCV measurement, and that a sufficient amount of relaxation time has passed since the battery was last subjected to current that the open circuit voltage no longer noticeably changes with time. The no-load capacity value Qmax valid for a particular new battery can be stored in the memory 15 prior to operation of the battery fuel gauge system 10, and updated using appropriate means during battery operation.

To understand how various values of the DOD can be used, it should be understood that the amount of charge actually available from the battery to power a device drawing a substantial amount of load current is less than the total no-load battery capacity because the actual voltage of a battery with a load current flowing through its internal impedance is reduced to the manufacturer's "safe" termination voltage Vmin more quickly for higher values of load current and/or higher values of internal battery impedance due to the voltage drop across the internal battery impedance. This is evident from the equation $$V(DOD)=OCV(DOD)-I*R\_battery(DOD), \quad (Eq. 1)$$

where V(DOD) is the battery voltage at a particular DOD and R_battery(DOD) is the battery impedance at that DOD. The total no-load (i.e., zero-current) battery capacity Qmax is used as an intermediate parameter in computing the actual available battery capacity at a particular load current I.

Figure 4:
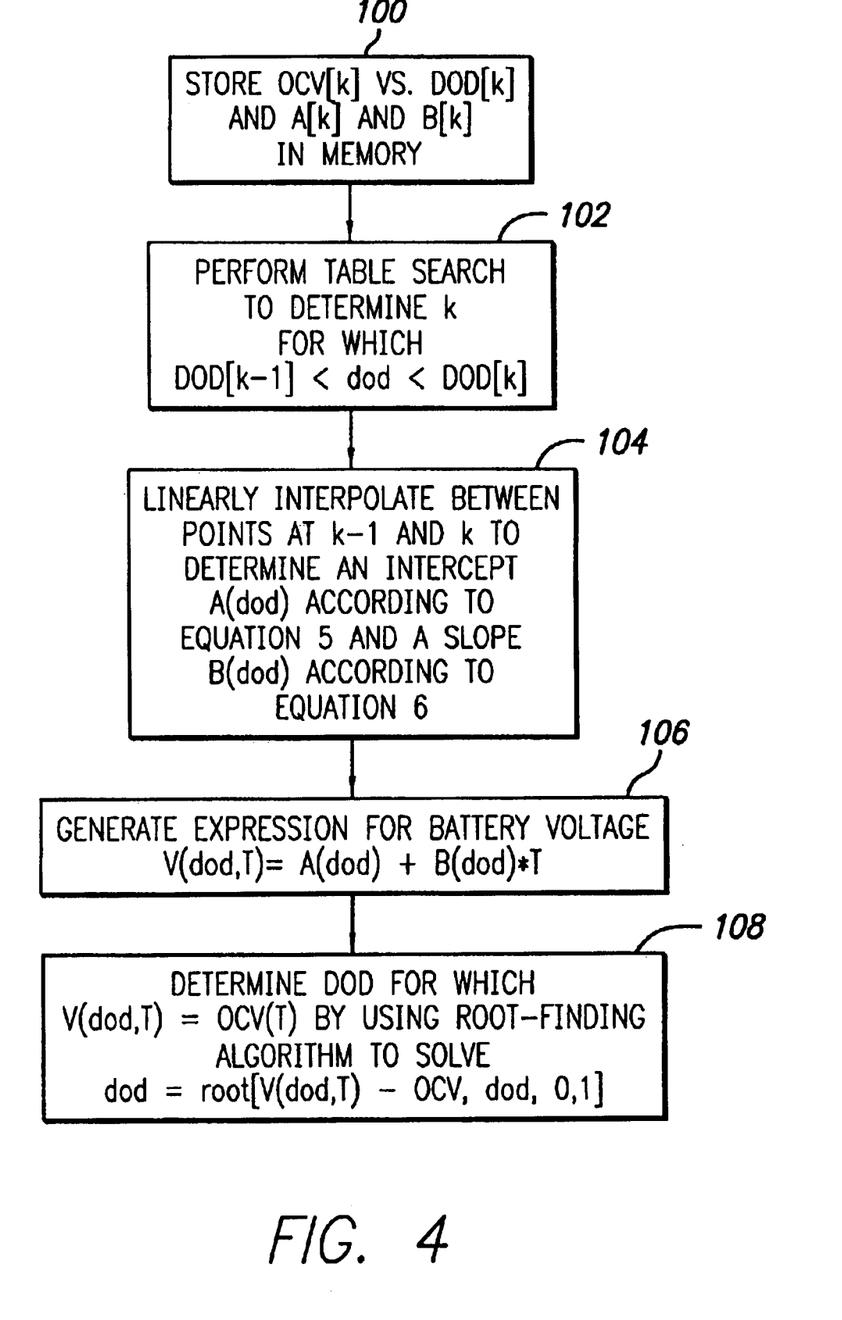
FIG. 4 is a flowchart of a program executed by an embedded processor in the block diagram of FIG. 2 to determine when open circuit battery voltage measurements should be made in order to determine SOC and DOD in accordance with the present invention.

The flow chart of FIG. 4 indicates how embedded processor 13 of FIG. 2 uses the stored database to the determine DOD(OCV) i.e., to determine DOD as a function of both OCV and temperature T.

As indicated in block 100 of FIG. 4, the above-mentioned table of A[k] and B[k] required to interpolate the expression for V(DOD,T) is loaded into memory 15 of FIG. 2. As indicated in block 102 of FIG. 4, a table search of the database is performed using a conventional database search algorithm to find a value of the index "k" so that the particular DOD satisfies the expression $$DOD[k-1]<DOD<DOD[k]. \quad (Eq. 2)$$

Once a value of k satisfying this expression is found, an intercept A(DOD) and slope B(DOD) can be found by linear interpolation between the database points A[k-1], DOD[k-1] and A[k] and DOD[k], and B[k-1], DOD[k-1] and B[k] and DOD[k] as indicated in Equations 5 and 6:

$$A(DOD) = \frac{A_{k-1} \cdot DOD_k - DOD_{k-1} \cdot A_k}{DOD_k - DOD_{k-1}} + \frac{A_k - A_{k-1}}{DOD_k - DOD_{k-1}} \cdot DOD \quad (Eq. 3)$$

$$B(DOD) = \frac{B_{k-1} \cdot DOD_k - DOD_{k-1} \cdot B_k}{DOD_k - DOD_{k-1}} + \frac{B_k - B_{k-1}}{DOD_k - DOD_{k-1}} \cdot DOD. \quad (Eq. 4)$$

Block 104 of FIG. 4 indicates the computation of the intercept coefficient and slope so as to provide linear interpolation between the k−1 and k points of the above-mentioned database. The table search mentioned above is used to determine the index k used in the above equations and can be performed using various known table search algorithms, such as bi-section table search algorithms.

As indicated in block 106 of FIG. 4, the coefficients A(DOD) and B(DOD) can be thought of as coefficients for determining the temperature dependence of V(DOD,T), or as the intercepts and slopes which define the straight line equation $$V(DOD,T)=A(DOD)+B(DOD)*T. \quad (Eq. 5)$$

The term V(DOD,T) of Equation 5 provides the battery voltage as a function of the interpolated DOD and the temperature T of the battery at the time when the corresponding OCV was measured.

Block 108 of FIG. 4 indicates the process of using a conventional root-finding algorithm to find a value of DOD that satisfies the expression OCV=V(DOD,T). As is the usual procedure, the root-finding algorithm uses a maximum possible root value of 1 and a minimum possible root value of 0 to bracket the value of the root to be determined in order to simplify the root-finding process. The root-finding process to be performed by the root-finding algorithm can be mathematically expressed by $$DOD=\text{root}[(V(DOD,T)-OCV, DOD, 0, 1)], \quad (Eq. 6)$$

which indicates that the root, or value of DOD, which causes V(DOD,T)−OCV to be equal to 0 is iteratively determined according to the root-finding algorithm, within the boundaries 0 and 1.

When current flowing through the battery is small (i.e., is small enough to not cause a voltage drop of more then 1–2% of battery voltage) but is high enough to be measured, correction of the voltage drop due to the internal battery impedance can be made with good precision using a simple model represented by OCV=V−I*R(DOD). This is due to the fact that non-linear effects are negligible at low current, and transient effects are absent if the battery current was unchanged for a sufficiently long time. At the other hand, R(DOD) dependence is usually smooth, and therefore the error in estimating battery resistance due to the deviation of the DOD estimated from the measured voltage value without correction from the true value will be negligible. The "true value" is R(DOD), where DOD is estimated from the "true OCV", which is OCV−I*R and is not available because of the recursive cycle required wherein the internal resistance R is needed to obtain the true OCV, the true OCV is needed to obtain the DOD, and the true DOD is needed to obtain R, and so forth. But the "corrected OCV" is more accurate than the uncorrected value and can be then used to obtain an improved value of DOD as described above, to increase the method's accuracy for the cases where the current during a passive phase is small but measurable.

Various well-known table-searching algorithms and root-algorithms can be readily utilized in the flow chart of FIG. 4. For example, see "Numerical Recipes in Fortran, Second Edition", William H. Press, Saul A. Teukolsky, William T. Vetterling, Brian P. Flannery, Cambridge University Press, 1992; for "Table-search" algorithms see page 110, and for "Root-finding" algorithms, see page 343.

The remaining run-time is computed using Qmax and the knowledge of the current DOD, and the battery impedance is taken into consideration.

The determination of remaining run-time of the battery-powered device can be accomplished using the value of Qmax as defined above. To accomplish this, the present DOD value (DOD) is obtained using the expression $$DOD=DOD0+t*I/Qmax, \quad (Eq. 7)$$

where DOD0 is the starting DOD obtained using the above mentioned algorithms, and I is the average load current that has been flowing for the battery for the amount of time t since the beginning of the present discharge cycle. To determine a run-time, the value of the present DOD is substituted into above Equation 1, to provide $$V(DOD0+t*I/Q\text{max})=OCV(DOD0+t*I/Q\text{max})-I*R\_\text{battery}(DOD0+t*I/Q\text{max}). \quad \text{(Eq. 8)}$$

The time variable t in Equation 8 is iterated by a conventional algorithm executed by embedded processor 13 to find a value of t which causes the battery voltage given by Equation 8 to be equal to the manufacturer's termination value Vmin. That value of t represents the total run-time t_total that could be supplied to the present load by the battery at the time at which the present discharge cycle started. The remaining run-time t_rem, i.e., the amount of time (measured from the present time) during which the battery (at its present depth of discharge) can continue to supply the present discharge current before the battery voltage decreases to Vmin, is computed by embedded processor 13 from the expression $$t\_\text{rem}=t\_\text{total}-\text{duration of present discharge cycle.} \quad \text{(Eq. 9)}$$

The above described technique of determining the SOC or DOD of a battery thus avoids the effects on the battery SOC of both the self-discharge current and the stand-by battery leakage current through the battery-powered device during the passive time intervals ordinarily experienced by the battery.

This is in contrast to the previously mentioned prior algorithms that determine the SOC when the battery is fully charged and then integrate the current from the original fully charged SOC value, wherein the effect of the internal self-discharge current is either completely ignored or is inaccurately estimated, and wherein the integration of the very low (and therefore inaccurately measured) standby current also is inaccurate. The present invention avoids these problems by providing a new technique that is independent of both the internal self-discharge current and low standby current during the passive phases. The integration (over time) referred to above is accomplished by accumulating values of the external battery current multiplied by the durations during which the battery current flows, and the resulting change in charge is algebraically added to the initial SOC value determined immediately before the battery goes into an active phase in which there is a substantial flow of external current through the battery. Since the initial value of the SOC based on an open circuit measurement of battery voltage while the battery is in a relaxed condition is very precise immediately before the beginning of an active phase, and since the change in SOC due to the integration of the flow of current into and/or out of the battery during its active phase also is very precise, the summation of the two to obtain of the present SOC also is very precise.

When a battery is switched from an active phase with substantial flow of external battery current to a passive phase with very low external standby current flow, the open circuit cell voltage continues to change for a while, typically from a half an hour to several hours, before the battery is "relaxed" sufficiently for the open circuit cell voltage to accurately represent to the present SOC and DOD at the present battery temperature. Since the accurate correlation between the measured open circuit cell voltage and the battery's SOC is valid only if the battery is "relaxed", the system of the present invention defines the conditions under which the open circuit cell voltage measurements can be made so that they accurately correlate to the battery's present SOC.

Thus, the present invention provides very accurate indication of SOC of a battery during both passive and active phases of battery operation by utilizing cell voltage measurement to determine SOC during passive stages of battery operation and by using the latest SOC determination of cell as the starting value of the SOC for integration of battery current when an active phase of battery operation begins. When the active phase ends, the change in SOC resulting from integration of the battery current during the active phase is used to update the SOC. Consequently, there is no need to measure the low stand-by current in the passive phase, and no need to estimate the self-discharge current of the battery. Consequently, the above-mentioned problems of voltage measurement during the active phases of operation and current integration during the passive phases are avoided.

Additionally, the present invention avoids the errors resulting from impedance correction s needed for determination of the SOC based on battery or cell voltage under load conditions during the active phase of operation. Precise impedance correction would require a complex transient non-linear modeling of the system that would take into account the variability of cell impedance with SOC, aging, temperature, deviations in manufacturing process between cells, and transient effects due to changing load. Because of limited computing resources available in mobile applications, such exact modeling is not practical, but neglecting any of the above mentioned factors nevertheless results in large errors in SOC estimation.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, OCV and temperature can be measured on a single cell of a battery pack, or the average value of all cells in the battery pack can be used. OCV can be measured not only under the condition of zero battery current, but also under the condition of a non-zero current that is sufficiently low so as not to introduce significant error. Accordingly, and by way of definition, the term "zero-current" or "no-load conditions" as used herein to refer to battery current includes non-zero battery current that is sufficiently low that it does not introduce significant error in the determination of the OCV of the battery. The definition of "passive phase" means only that the current is sufficiently low and deviations from low current are sufficiently short to not distort battery or cell voltage significantly. For example, battery or cell voltage measurement can be made at the final stage of charging, if the battery current during this stage is sufficiently low, and measurement can be made when the battery-powered device is actually in use but no significant current has flown for a long time due to the particular mode of operation. When the battery current is sufficiently low, some form of impedance correction can be used to make the measured voltage closer to the actual no-load voltage, as errors of correction at low current will not be significant due to the small value of the correction. Determination of the moment when the OCV is considered sufficiently relaxed since last the high-load period can be accomplished by using a fixed time duration, a time duration made dependent on the temperature or expected DOD, or through observing the derivative of the voltage change. Measurement of the OCV prior to each usage of battery powered device can be accomplished by making the OCV measurement after predefined periods of time when battery is not in use and taking the last one measured before further usage is started, or by activating the measurement by the same control used to activate the battery powered device.

What is claimed is:

1. A method of determining a value of a variable representing the amount of charge presently stored in a battery, comprising:
    (a) determining that the battery is in a zero-current relaxed condition by establishing that no more than a negligible amount of external current is flowing through the battery and that a sufficient amount of time has passed since a last significant current flow through the battery to ensure that the battery voltage is no longer significantly changing;
    (b) measuring an open circuit voltage (OCV) of the battery prior to a period of time during which flow of current through the battery is not negligible; and
    (c) using a predetermined dependence of the variable on the open circuit voltage of the battery to obtain a value of the variable which corresponds to the measured open circuit voltage.

2. The method of claim 1 including measuring current flowing through the battery at a moment in an active period during which current flowing through the battery is not negligible, and calculating the value of the variable at that moment using the measured current and an earlier value of the variable determined immediately prior to re-connecting a load or a charger.

3. The method of claim 2 including calculating the value of the variable by integrating the current during the active period and modifying the earlier value of the variable by a value of charge passed through the battery during the active period divided by a value of total no-load capacity of the battery.

4. The method of claim 1 wherein the variable is the state of charge (SOC) of the battery.

5. The method of claim 1 wherein the variable is the depth of discharge (DOD) of the battery.

6. The method of claim 5 including storing a database in a memory, data of the database representing a relationship between the OCV of the battery and the DOD of the battery, wherein step (c) includes utilizing the database to correlate the measured open circuit voltage with a corresponding value of the DOD.

7. The method of claim 6 including monitoring the temperature of the battery by means of a temperature sensor in thermal contact with the battery, the database including data representing corresponding values of the OCV of the battery and DOD of the battery as K values of OCV of the battery at known corresponding values of DOD of the battery at each of N temperatures T1, T2 . . . TN, the database also including K intercepts A[k] and K slopes B[k] defining K equations V[k](T)=A[k]+B[k]*T, wherein k is an index and T is a variable representing the temperature of the battery, and the values A[k] and B[k] have been obtained by linear regression of the OCV and DOD values, the method including operating a processor to execute a first algorithm utilizing a table search algorithm and a root-finding algorithm in conjunction with the database to determine values of DOD corresponding to values of OCV measured from the battery.

8. The method of claim 7 including operating the processor to execute a second algorithm to determine a value of total run-time that would be required for a load, when operatively connected to the battery, to reduce the open circuit voltage of the battery to a predetermined lower limit.

9. The method of claim 8 wherein the second algorithm also determines a remaining run-time of the load operatively connected to the battery by integrating a load current supplied by the battery to the load to determine a net transfer of charge from the battery and a duration of the integrating and determines the remaining run-time by subtracting the duration of the integrating from the total run-time.

10. The method of claim 8 wherein the second algorithm determines the total run-time by iterating a variable t in the equation $$V(DOD0+t*I/Qmax)=OCV(DOD0+t*I/Qmax)-I*R\_battery(DOD0+t*I/Qmax)$$

to a value that causes $OCV(DOD0+t*I/Qmax)-I*R\_battery(DOD0+t*I/Qmax)$ to be equal to the predetermined lower limit and using that value as the total run-time, where Qmax is a total zero-current capacity of the battery, I is the average current supplied by the battery to the load during the active phase while the load is operatively connected to the battery, DOD0 is a depth of discharge corresponding to the measured open circuit voltage, $V(DOD0+t*I/Qmax)$ is the voltage between terminals of the battery as a function of $DOD0+t*I/Qmax$, and $R\_battery(DOD0+t*I/Qmax)$ is the internal resistance of the battery as a function of $DOD0+t*I/Qmax$.

11. The method of claim 8 wherein the second algorithm determines the total run-time by iterating a variable t in the equation $$V(DOD0+t*I/Qmax,T(t))=OCV(DOD0+t*I/Qmax,T(t))-I*R\_battery(DOD0+t*I/Qmax,T(t))$$

to a value that causes $OCV(DOD0+t*I/Qmax,T(t))-I*R\_battery(DOD0+t*I/Qmax,T(t))$ to be equal to the predetermined lower limit and using that value as the total run-time, where Qmax is a total zero-current capacity of the battery, I is the average current supplied by the battery to the load during active phase, DOD0 is a depth of discharge corresponding to the measured open circuit voltage, $V(DOD0+t*I/Qmax,T(t))$ is the voltage between terminals of the battery as a function of $DOD0+t*I/Qmax$ and predicted temperature dependence on time T(t), and $R\_battery(DOD0+t*I/Qmax, T(t))$ is the internal resistance of the battery as a function of $DOD0+t*I/Qmax$ and predicted temperature dependence on time T(t).

12. The method of claim 1 wherein step (a) includes determining that a predetermined amount of time has elapsed since the last significant flow of current through the battery.

13. The method of claim 12 wherein the predetermined amount of time is at least 10 minutes.

14. The method of claim 1 wherein sufficiently low average current flows through the battery during the OCV measurement so as to cause a voltage drop or voltage rise of less than 1% of the total no-load voltage of the battery due to internal impedance of the battery.

15. The method of claim 1 including performing a correction of the measured voltage of the battery to compensate for a voltage drop due to the internal impedance of the battery while a nearly negligible amount of current is flowing through the battery in order to obtain the open circuit voltage.

16. The method of claim 1 including detecting the rate of change of the open circuit voltage of the battery to determine when to perform step (b).

17. A system for determining a value of variable representing the amount of charge presently stored in a battery, comprising:
    (a) a processor coupled to a digital bus, and a memory for storing data representing the relationship between the OCV (open circuit voltage) and DOD (depth of discharge) of the battery, a first ADC, and a second ADC all coupled to the digital bus;

(b) a first program stored in the memory for execution by the processor for determining that the battery is in a zero-current relaxed condition by establishing that no more than a negligible amount of external current is flowing through the battery and that a sufficient amount of time has passed since a last significant current flow through the battery to ensure that the battery voltage is no longer significantly changing;

(c) circuitry including the first ADC for measuring an open circuit voltage (OCV) of the battery prior to a period of time during which flow of current through the battery is not negligible; and (d) a second program stored in the memory for execution by the processor for correlating the measured open circuit voltage with a corresponding value of the variable and selecting the corresponding value as a value of the variable.

18. The system of claim 17 wherein the first program causes the processor to measure current flowing through the battery at a moment in an active period during which current flowing through the battery is not negligible, and the second program causes the processor to calculate the value of the variable at that moment using the measured current and an earlier value of the variable determined immediately prior to re-connecting a load or a charger.

19. The system of claim 18 wherein the second program causes the processor to calculate the value of the variable by integrating the current during the active period and modifying the earlier value of the variable by a value of charge passed through the battery during the active period divided by a value of total no-load capacity of the battery.

20. The system of claim 19 wherein the second program causes the processor to perform a correction of the measured voltage of the battery to compensate for a voltage drop due to the internal impedance of the battery while a nearly negligible amount of current is flowing through the battery in order to obtain the open circuit voltage.

21. The system of claim 17 wherein the variable is the state of charge (SOC) of the battery.

22. The system of claim 17 wherein the first program causes the processor to determine that the battery is in a zero-current relaxed condition by determining that a predetermined amount of time has elapsed since the last significant flow of current through the battery.

23. The system of claim 17 wherein the first program causes the processor to determine that the battery is in a zero-current relaxed condition by detecting the rate of change of the open circuit voltage of the battery.

24. The system of claim 17 wherein the second program accesses the stored data to correlate the measured open circuit voltage with a corresponding value of the DOD.

25. The system of claim 17 including a temperature sensor in thermal contact with the battery and a third ADC coupled to the digital bus.

26. The system of claim 25 wherein the processor monitors the temperature of the battery by means of a temperature sensor in thermal contact with the battery, and the stored data includes data representing corresponding values of the OCV of the battery and DOD of the battery as K values of OCV of the battery at known corresponding values of DOD of the battery at each of N temperatures T1, T2 . . . TN, the database also including K intercepts A[k] and K slopes B[k] defining K equations V[k](T)=A[k]+B[k]*T, wherein k is an index and T is a variable representing the temperature of the battery, and the values A[k] and B[k] have been obtained by linear regression of the OCV and DOD values, the processor operating to execute a first algorithm utilizing a table search algorithm and a root-finding algorithm in conjunction with the database to determine values of DOD corresponding to values of OCV measured from the battery.

27. The system of claim 26 including operating the processor to execute a second algorithm to determine a value of total run-time that would be required for a load, when operatively connected to the battery, to reduce the open circuit voltage of the battery to a predetermined lower limit.

28. The system of claim 27 wherein the second algorithm also determines a remaining run-time of the load operatively connected to the battery by integrating a load current supplied by the battery to the load to determine a net transfer of charge from the battery and a duration of the integrating and determines the remaining run-time by subtracting the duration of the integrating from the total run-time.

29. The system of claim 27 wherein the second algorithm determines the total run-time by iterating a variable t in the equation $$V(DOD0+t*I/Qmax)=OCV(DOD0+t*I/Qmax)-I*R\_battery(DOD0+t*I/Qmax)$$

to a value that causes $OCV(DOD0+t*I/Qmax)-I*R\_battery(DOD0+t*I/Qmax)$ to be equal to the predetermined lower limit and using that value as the total run-time, where Qmax is a total zero-current capacity of the battery, I is the average current supplied by the battery to the load during the active phase while the load is operatively connected to the battery, DOD0 is a depth of discharge corresponding to the measured open circuit voltage, $V(DOD0+t*I/Qmax)$ is the voltage between terminals of the battery as a function of $DOD0+t*I/Qmax$, and $R\_battery(DOD0+t*I/Qmax)$ is the internal resistance of the battery as a function of $DOD0+t*I/Qmax$.

30. The system of claim 27 wherein the second algorithm determines the total run-time by iterating a variable t in the equation $$V(DOD0+t*I/Qmax,T(t))=OCV(DOD0+t*I/Qmax,T(t))-I*R\_battery(DOD0+t*I/Qmax,T(t))$$

to a value that causes $OCV(DOD0+t*I/Qmax,T(t))-I*R\_battery(DOD0+t*I/Qmax,T(t))$ to be equal to the predetermined lower limit and using that value as the total run-time, where Qmax is a total zero-current capacity of the battery, I is the average current supplied by the battery to the load during active phase, DOD0 is a depth of discharge corresponding to the measured open circuit voltage, $V(DOD0+t*I/Qmax,T(t))$ is the voltage between terminals of the battery as a function of $DOD0+t*I/Qmax$ and predicted temperature dependence on time T(t), and $R\_battery(DOD0+t*I/Qmax, T(t))$ is the internal resistance of the battery as a function of $DOD0+t*I/Qmax$ and predicted temperature dependence on time T(t).

31. A system for determining a value of variable representing the amount of charge presently stored in a battery, comprising:

(a) means for determining that the battery is in a zero-current relaxed condition by establishing that no more than a negligible amount of external current is flowing through the battery and that a sufficient amount of time has passed since a last significant current flow through the battery to ensure that the battery voltage is no longer significantly changing;

(b) means for measuring an open circuit voltage (OCV) of the battery prior to a period of time during which flow of current through the battery is not negligible;

(c) means for correlating the measured open circuit voltage with a corresponding value of the variable; and (d) means for selecting the corresponding value as the value of variable.

32. The system of claim 31 including means for measuring current flowing through the battery at a moment in an active period during which current flowing through the battery is not negligible, and means for calculating the value of the variable at that moment using the measured current and an earlier value of the variable determined immediately prior to re-connecting a load or a charger.

33. The system of claim 32 including means for calculating the value of the variable by integrating the current during the active period and modifying the earlier value of the variable by a value of charge passed through the battery during the active period divided by a value of total no-load capacity of the battery.

34. The system of claim 31 wherein the variable is the state of charge (SOC) of the battery.

35. The system of claim 31 wherein sufficiently low average current flows during the OCV measurement so as to cause a voltage drop or voltage rise of less than 1% of the total no-load voltage of the battery due to internal impedance of the battery.

36. The system of claim 35 including means for storing a database in a memory, data of the database representing a relationship between the OCV of the battery and the DOD of the battery, and means for utilizing the database to correlate the measured open circuit voltage with a corresponding value of the DOD.

37. The system of claim 36 including means for monitoring the temperature of the battery, the database including data representing corresponding values of the OCV of the battery and DOD of the battery as K values of OCV of the battery at known corresponding values of DOD of the battery at each of N temperatures T1, T2 . . . TN, the database also including K intercepts A[k] and K slopes B[k] defining K equations V[k](T)=A[k]+B[k]*T, wherein k is an index and T is a variable representing the temperature of the battery, and the values A[k] and B[k] have been obtained by linear regression of the OCV and DOD values, and a processor configured to execute a first algorithm utilizing a table search algorithm and a root-finding algorithm in conjunction with the database to determine values of DOD corresponding to values of OCV measured from the battery.

38. The system of claim 31 including means for performing a correction of the measured voltage of the battery to compensate for a voltage drop due to the internal impedance of the battery in order to obtain the open circuit voltage while a nearly negligible amount of current is flowing through the battery.

* * * * *